(12) United States Patent
Yang et al.

(10) Patent No.: US 7,635,899 B2
(45) Date of Patent: Dec. 22, 2009

(54) STRUCTURE AND METHOD TO FORM IMPROVED ISOLATION IN A SEMICONDUCTOR DEVICE

(75) Inventors: Haining S. Yang, Wappingers Falls, NY (US); Thomas W. Dyer, Pleasant Valley, NY (US); William C. Wille, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 11/622,057

(22) Filed: Jan. 11, 2007

(65) Prior Publication Data

US 2008/0171420 A1  Jul. 17, 2008

(51) Int. Cl.
 *H01L 27/092* (2006.01)
(52) U.S. Cl. .................. 257/371; 257/506; 257/E21.067
(58) Field of Classification Search .................. 257/510, 257/E21.547, E21.548, 369, 371, 506, E27.067; 438/408, 409, 427
See application file for complete search history.

(56) References Cited

U.S. PATENT DOCUMENTS

| 6,207,534 | B1 | 3/2001 | Chan et al. |
| 6,818,528 | B2 | 11/2004 | Mandelman et al. |
| 6,875,697 | B2 | 4/2005 | Trivedi |
| 7,067,387 | B2 * | 6/2006 | Lin ............................. 438/409 |
| 2005/0067294 | A1 | 3/2005 | Choe et al. |

OTHER PUBLICATIONS

V. Lehmann et al., "Porous Silicon Formation: A Quantum Wire Effect", Appl. Phys. Lett., vol. 58, No. 8, Feb. 25, 1991, pp. 856-858.

* cited by examiner

*Primary Examiner*—M. Wilczewski
*Assistant Examiner*—Toniae M Thomas
(74) *Attorney, Agent, or Firm*—Scully, Scott, Murphy & Presser, P.C.; H. Daniel Schnurmann

(57) ABSTRACT

A method is disclosed for forming an STI (shallow trench isolation) in a substrate during CMOS (complementary metal-oxide semiconductor) semiconductor fabrication which includes providing at least two wells including dopants. A pad layer may be formed on a top surface of the substrate and a partial STI trench is etched in the upper portion of the substrate followed by etching to form a full STI trench. Boron is implanted in a lower area of the full STI trench forming an implant area which is anodized to form a porous silicon region, which is then oxidized to form a oxidized region. A dielectric layer is formed over the silicon nitride layer filling the full STI trench to provide, after etching, at least two electrical component areas on the top surface of the substrate having the full STI trench therebetween.

7 Claims, 5 Drawing Sheets

STRUCTURE AND METHOD TO FORM IMPROVED ISOLATION IN A SEMICONDUCTOR DEVICE

FIELD OF THE INVENTION

This invention relates to a method for fabricating shallow trench isolation (STI) regions during semiconductor fabrication, and more particularly, fabricating STI regions during fabrication of complementary metal-oxide semiconductor (CMOS) devices to enhance inter-well isolation and intra-well isolation of doped substrate areas.

BACKGROUND OF THE INVENTION

Complementary metal-oxide semiconductors (CMOS) are a major class of integrated circuits (ICs). CMOS chips include microprocessors, microcontrollers, static RAM, and other digital logic circuits. An advantage of CMOS technology is that it only uses significant power when its transistors are switching between on and off states. Consequently, CMOS devices use significantly less power and produce less heat than other forms of logic devices. CMOS technology also allows a high density of logic functions on a chip. In present semiconductor technology, CMOS devices, such as nFETs or pFETs, are typically fabricated upon semiconductor wafers, such as silicon (Si).

Generally CMOS processing includes forming multiple shallow trench isolation (STI) regions in a top layer of a substrate. The STI regions are typically formed to isolate, for example, a silicon on insulator (SOI) device region or an electronic component area in an SOI substrate, from another device region. The SOI device region may be formed by selectively implanting p-type or n-type dopants into the semiconductor layer. A plurality of wells, e.g., P-wells, N-wells, can also be formed in the device region. For example, a P-well is formed of a P-type semiconductor material, and an N-well is formed of an N-type semiconductor material. A series of P-wells and/or a series of N-wells can be formed in the SOI substrate. It is noted that the N-type device region is typically used when a pFET channel is to be subsequently formed, while a P-type device region is typically used when an nFET channel is to be subsequently formed.

The STI regions are formed utilizing processing steps that are known to those skilled in the art including, for example, trench definition and etching, optionally lining the trench with a diffusion barrier, and filling the trench with a trench dielectric such as an oxide. After the trench fill, the structure may be planarized and an optional densification process step may be performed to densify the trench dielectric.

Currently, various oxides and nitrides are used as the STI dielectric material. As CMOS processing scales smaller, shallow trench isolation (STI) dimension needs to be reduced, resulting in poorer isolation (well to well, or junction to well) which may result in high leakage, or electrical breakdown.

Additionally, there are two types of isolation in a CMOS circuit. Inter-well STI isolates two different wells (between an N-well and a P-well), and intra-well STI isolates devices within a well (within an N-well or within a P-well). Although deeper STI trenches give better isolation, the depth of inter-well STI trenches needs to stay within the well boundary to maintain electrical connection of the well.

It would therefore be desirable to provide a method to create wider and deeper inter-well and intra-well isolation without negatively impacting circuit density. It would also be desirable to provide different size inter-well and inter-well STI trench isolation without negatively impacting circuit density. It would further be desirable to enhance performance of a CMOS chip/wafer without significantly increasing the cost of manufacturing while creating wider and deeper inter-well and intra-well STI trenches.

SUMMARY OF THE INVENTION

In an aspect of the present invention, an STI trench in a substrate for semiconductor fabrication is disclosed. The substrate includes a well including a dopant positioned between at least two electrical component areas on a top surface of the substrate and at least one STI trench in the substrate including an upper portion of the at least one STI trench defining a width of a trench opening at a surface of the substrate. The at least one STI trench including an oxidized porous region in the substrate adjacent a bottom portion of the at least one STI trench.

In a related aspect, the oxidized porous region of the at least one STI trench includes a width greater than the width of the trench opening.

In a related aspect, the at least one STI trench is filled with a dielectric.

In a related aspect, the dielectric includes an oxide.

In a related aspect, the STI trench has a lower width less than an upper width and where both the upper and lower widths are greater than the width of the trench opening.

In a related aspect, the STI trench is a first STI trench defining a first opening having a first width, and a second STI trench in the substrate defines a second opening having a second width. The oxidized porous region of the first trench has a first width and a first depth, and the oxidized porous region of the second trench having a second width and a second depth.

In a related aspect, the well is a first well having a first dopant of a first conductivity and the substrate further includes a second well having a second dopant of a second conductivity. The at least one STI trench is a first trench which divides an upper portion of the first and second wells and a second STI trench divides the upper portion of the first well or the second well. Upper portions of the first and second STI trenches define first and second widths of first and second trench openings, respectively. Both the first and second trenches include the oxidized porous region.

In a related aspect, the first STI trench is wider and deeper than the second STI trench including their respective oxidized porous regions.

In a related aspect, the first STI trench is deeper than the second STI trench and located between the first well having n-type dopant and the second well having a p-type dopant, and the second STI trench is located within the second well.

In a related aspect, the second trench is adapted to allow the second electrical conductivity within the second well beneath a bottom of the second STI trench.

In a related aspect, the first and second STI trenches both include upper implant regions having a greater width than lower implant region widths. The widths of both the lower and upper implant regions are greater than widths of their respective trench opening widths.

In another aspect according to the present invention, a method for processing a semiconductor substrate for forming an STI (shallow trench isolation) region in a substrate is provided and may be used during CMOS (complementary metal-oxide semiconductor) fabrication. The inventive method includes providing a substrate having a well including a dopant. A pad layer stack is deposited on the substrate. An STI trench is formed in a hard mask.

In a related aspect, the step of forming the STI trench further includes the steps of: etching a partial STI trench in an upper portion of the substrate which may divide the well; forming a silicon nitride spacer layer above a pad layer on the top surface of the substrate; etching the silicon nitride spacer layer to form spacers on opposite sides of the trench opening; and etching the partial STI trench to form a full STI trench.

In a related aspect, the step of forming the implant region includes implanting boron into the substrate adjacent the lower portion of the STI trench to form the implant region. The implant region is anodized to form a porous silicon region, and the implant region is oxidized to form an oxidized region.

In a related aspect, the method further includes after oxidizing the implant region: forming a dielectric layer on the top surface of the substrate filling the STI trench; and removing the dielectric layer using CMP to provide at least two electrical component areas on the top surface of the substrate having the STI trench therebetween including the oxidized implant region.

In a related aspect, the substrate includes at least a first well and a second well including dopants of a first conductivity and a second conductivity, respectively. The STI trench is a first STI trench dividing the first and second wells to provide two electrical component areas on the top surface of the substrate having the first STI trench therebetween. The second well has a second conductivity and is divided by a second STI trench to provide at least two electrical component areas on the top surface of the substrate having the second STI trench therebetween. Further, the step of implanting boron is implemented at a specified angle for each of the first and the second STI trenches such that the implant region of the first STI trench is wider and deeper than an implant region of the second STI trench.

In a related aspect, the method further comprises: depositing a silicon nitride spacer layer on the top surface of the substrate; and etching the spacer layer to form spacers on opposite sides of the trench opening.

In a related aspect, the method further includes forming a pad layer on the top surface of the substrate before etching the STI trench, and removing the pad layer from the top surface of the substrate when removing the dielectric layer.

In another aspect according to the present invention, a method is provided for processing a semiconductor substrate which comprises providing a first well including a first dopant of a first conductivity or at least two wells including dopants of either the first conductivity or a second dopant of a second conductivity in an upper portion of a substrate. A top surface of the substrate defines an STI trench opening having a trench opening width. A first STI trench is formed dividing the first and second wells or a plurality of STI trenches including the first STI trench dividing the first and second wells and a second STI trench dividing the second well. Boron is implanted in the substrate adjacent a lower portion of the STI trench forming an implant region. The implant region is anodized to form a porous silicon region, and then the implant region is oxidized to form an oxidized region. A dielectric layer is formed over the top surface of the substrate filling the STI trench. The dielectric layer is formed using CMP to provide at least two electrical component areas on the top surface of the substrate having the STI trench therebetween including the oxidized region and the STI trench is wider than the trench opening width.

In a related aspect, forming the dielectric layer includes a high density plasma (HDP) method.

In a related aspect, anodizing the implant region includes using hydrofluoric acid (HF) to form pores in the implant region to form the porous silicon region.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION OF THE INVENTION

Figure 1:
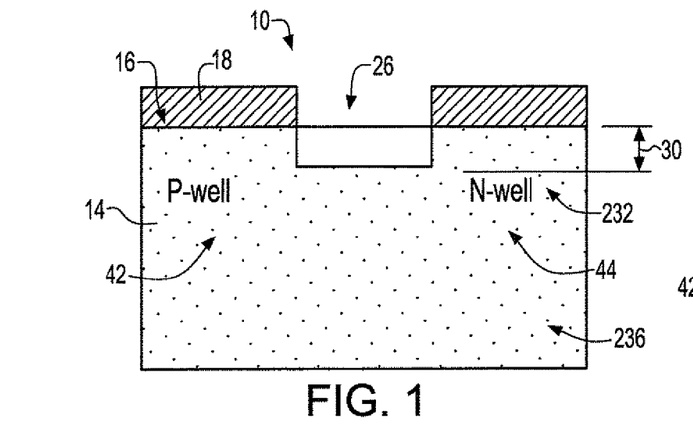
FIG. 1 is a block diagram according to an embodiment of the invention depicting a silicon substrate having a pad layer over a top surface thereof and a substantially central partial trench dividing a P-well region and a N-well region.

An exemplary embodiment of the method 10 for forming an STI (shallow trench isolation) on a substrate during CMOS (complementary metal-oxide semiconductor) fabrication according to the present invention is shown in FIGS. 1-8. Referring to FIG. 1, the method 10 begins for illustrative purposes by providing a substrate 14 of silicon which includes an upper portion 232 having a top surface 16 and a lower portion 236. A pad layer 18 which may comprise a film stack including a thin pad oxide and an overlaying pad nitride is located over the top surface 16 of the substrate 14. The pad oxide may be, for example, about 50-100 Å° (angstroms) and the pad nitride about 500-2000 Å° thick. The substrate 14 may also be a combination of silicon and another substance, for example, germanium. A partial trench 26 is formed through the pad layer 18 and in the substrate 14. The partial trench 26 extends downwardly from the top surface 16 a specified depth 30 which is less than the depth of a full trench 96, shown in FIG. 3. Also, for example, a hard mask may be used as a template, which is typically made of patterned metal or metal-oxide film, in forming the partial trench 26.

P-well dopant area 42 and N-well dopant area 44 were previously formed into the substrate utilizing techniques that are known to those skilled in the art. The partial STI (shallow trench isolation) trench 26 divides the P-well dopant area 42 and an N-well dopant area 44 in the substrate. The partial STI trench may be formed using conventional etching methods known in the semiconductor manufacturing industry.

Figure 2:
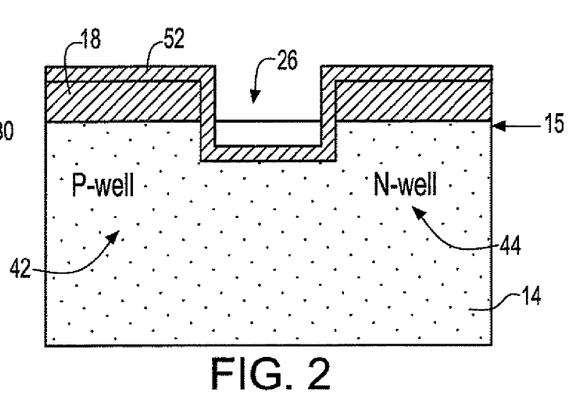
FIG. 2 is a block diagram of the silicon substrate shown in FIG. 1 depicting a layer of silicon nitride.

A silicon nitride layer 52 is formed over the pad layer 18 and fills the partial trench 26 with a layer of silicon nitride, as shown in FIG. 2. The silicon nitride layer 52 is a spacer layer for forming spacer 84 shown in FIG. 3 using conventional etching methods to remove the silicon nitride layer 52 and leaving the remaining spacers 84 on opposite sides of the upper portion 232 of the trench 92 shown in FIG. 3. The partial STI trench 56 shown in FIG. 2 is also etched to form the full STI trench 92 shown in FIG. 3, using conventional etching method know in the art.

Figure 3:
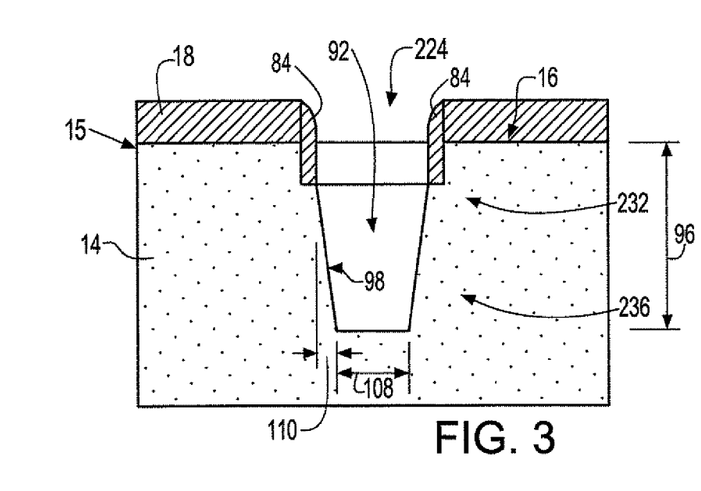
FIG. 3 is a block diagram of the silicon substrate shown in FIGS. 1 and 2 depicting silicon nitride spacers and a full trench.
Figure 4:
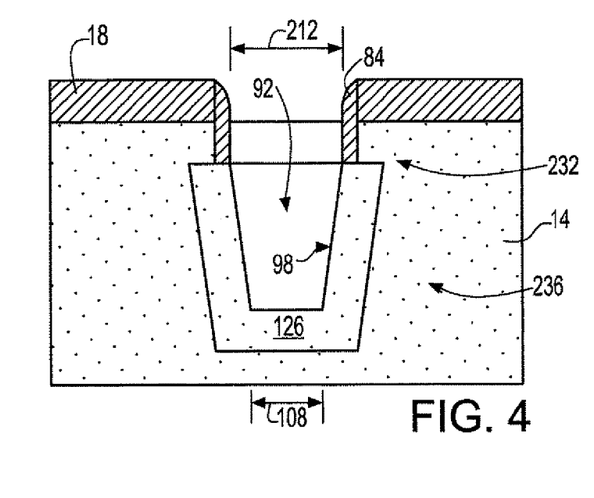
FIG. 4 is a block diagram of the silicon substrate shown in FIGS. 1-3 depicting a boron implantation region.

Referring to FIGS. 3 and 4, the full STI trench 92 is etched to a specified depth 96 and the side walls 98 are tapered inwardly toward one another so that the width 212 of the mouth or opening 224 of the trench 92 communicating with the top surface 16 of the substrate is wider than the bottom width 108 of the trench by a specified amount 110. The full trench 92 is generally "V" shaped.

Referring to FIG. 4, a low energy boron implantation using known techniques forms a boron implant area 126 surrounding a lower portion 236 of the trench 92. The low energy boron implantation is performed utilizing an implant energy of above 15 kev (kiloelectron volts) or less, with an implant energy of about 2 to about 50 kev being more preferred. In this step, a boron concentration of about 515 to about 516 atoms/cm2 is implanted. Other species such as BF2 may also be used. BF2 is a compound of Boron and Fluorine, which is also commonly used to implant Boron. When using B and F, F becomes F2 gas escaping from an Si substrate.

The semiconductor structure/substrate 14 is then annealed to activate the implanted dopants. The annealing process may use a furnace, a rapid thermal anneal chamber, or a spike anneal tool. The anneal temperature is typically in a range between 600° C. to 1100° C. The anneal ambient gas may include He, Ar, $O_2$, $N_2$, and mixtures thereof.

Figures 5, 7:
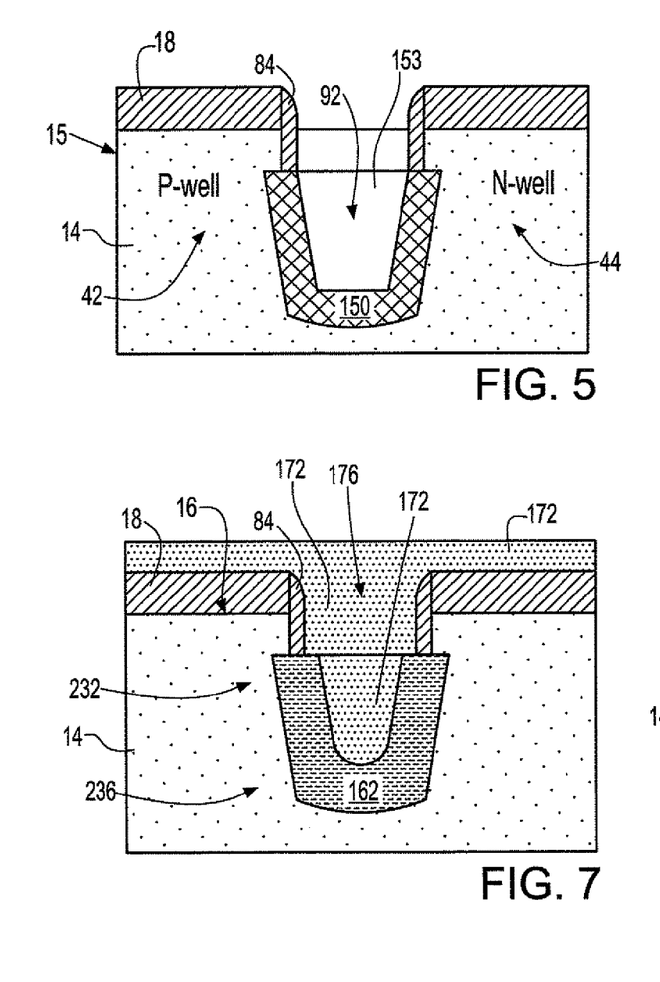
FIG. 5 is a block diagram of a porous silicon region formed in the silicon substrate of the trench shown in FIGS. 1-4.
FIG. 7 is a block diagram of the trench and oxidized trench region of FIG. 6 being filled with a dielectric layer.

Referring to FIGS. 4 and 5, the boron implant area 126 is anodized using, for example, hydrofluoric acid (HF) to form pores in the boron implant area 126. The anodization results in forming a porous silicon trench region 150 or implant region, which is generally "V" shaped, adjacent to the open well 153 of the trench 92.

Figure 6:
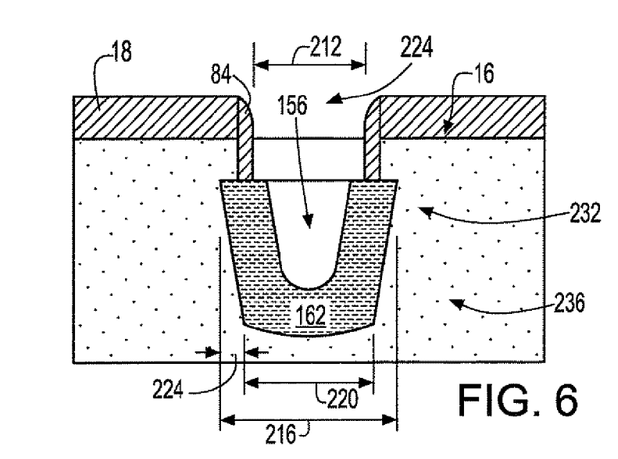
FIG. 6 is a block diagram depicting an oxidized trench region of the silicon substrate shown in FIG. 5.

Referring to FIG. 6, an oxidation procedure is applied to the porous silicon region 150 to form a "V" shaped oxidized region 162. The oxidation can be implemented with known techniques which may include, for example, at a low temperature (on the order of about 1100° C. or less) oxidation. The oxidation results in forming the "V" shaped oxidation region 162 which upper portion 232 is wider than the mouth width 212 of the full trench 156. The mouth width 212 is narrower than the upper and lower widths 216, 220, respectively, of the "V" shaped oxidation region 162, where the upper width 216 is larger than the lower width 220, as shown in FIG. 6, by a specified amount 224.

Referring to FIG. 7, an oxide layer 172, or another like trench dielectric is formed using conventional methods which may include, for example, a high-density plasma (HDP) method. The oxide layer 172 is formed over the silicon nitride layer and fills the full STI trench as shown in FIG. 7 to form a "V" shaped oxide filled region 162.

Figure 8:
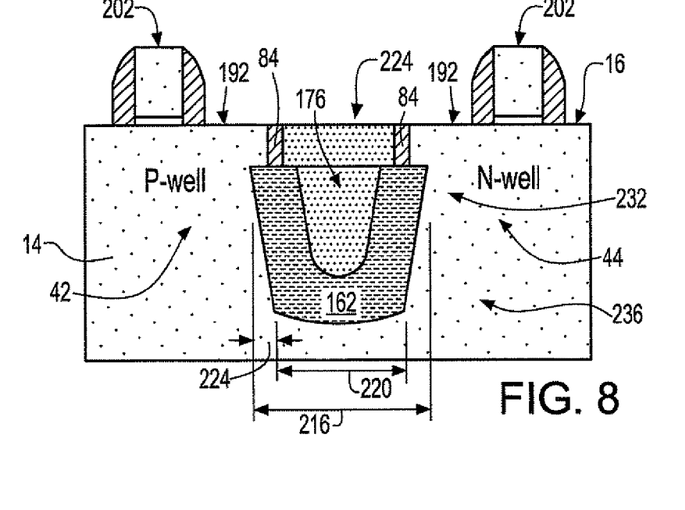
FIG. 8 is a block diagram of the substrate shown in FIG. 7 having removed the dielectric layer and the pad layer and formed transistors on a top surface of the substrate.

Referring to FIG. 8, the oxide layer 172 and the pad layer 18 have both been removed using conventional planarization techniques to expose the top surface 16 of the substrate. The oxide filled STI trench 176, which includes the "V" shaped oxide filled region 162, includes nitride spacers 84 in the upper portion 232 of the trench 176 adjacent to the top surface 16. Electrical elements 202 are formed on electrical component forming areas 192 on the top surface 16 of the silicon substrate 14 using conventional techniques which may include, techniques used during typical CMOS or BiCMOS processing of semiconductors. The electrical forming areas 192 may be formed using chemical mechanical polishing (CMP) techniques which involve mechanical polishing in the presence of chemicals which also contribute to the polishing process. The electrical elements 202 may be, for example, transistors, and more specifically MOSFETs (metal-oxide-semiconductor field-effect transistors). The oxide filled STI trench 176 is between the electrical components 202.

More specifically, the oxide trench 176 mouth or opening 224 adjacent to the top surface 16 of the substrate 14 has a specified width 212 (shown in FIG. 6). The oxide filled "V" shaped region 162 is in the lower portion 236 of the trench 176. The "V" shaped region 162 is wider than the mouth of the full trench 92 which has a narrower width 212 than the upper and lower widths 216, 220, respectively, of the oxide filled "V" shaped region 162. The oxide filled "V" shaped region 162 has a top width 216 which is larger than it's bottom width 220.

The trench 176 including the "V" shaped oxidation region 162 allows shallow trench isolation (STI) trench dimensions that require less component forming area 192 on the top surface 16 of the substrate while providing deeper and wider trench isolation within the substrate. This results in better trench isolation without sacrificing valuable component forming/device region real estate on the top surface 16 of the substrate. The method of the present invention minimizes the width 212 (shown in FIG. 6) of the mouth 224 of the trench 176 and has the capability to vary the trench size beneath the surface of the substrate 14 to maintain isolation between wells and associated electrical devices while minimizing well leakage.

Another illustrative embodiment according to the method of the present invention is shown in FIGS. 9-12. Generally, inter-well STI isolates two different wells, for example, N-well and P-wells, and intra-well STI isolates devices within a well, for example, within an N-well or within a P-well. The width of the inter-well STI is wider than the width of the intra-well STI, while both provide the isolation required. The deeper an STI, the better isolation, however, the depth of the intra-well STI needs to stay within the well boundary to maintain electrical connection of the well. Both types of STI trenches may be formed using conventional etching methods known in the semiconductor manufacturing industry.

Figure 9:
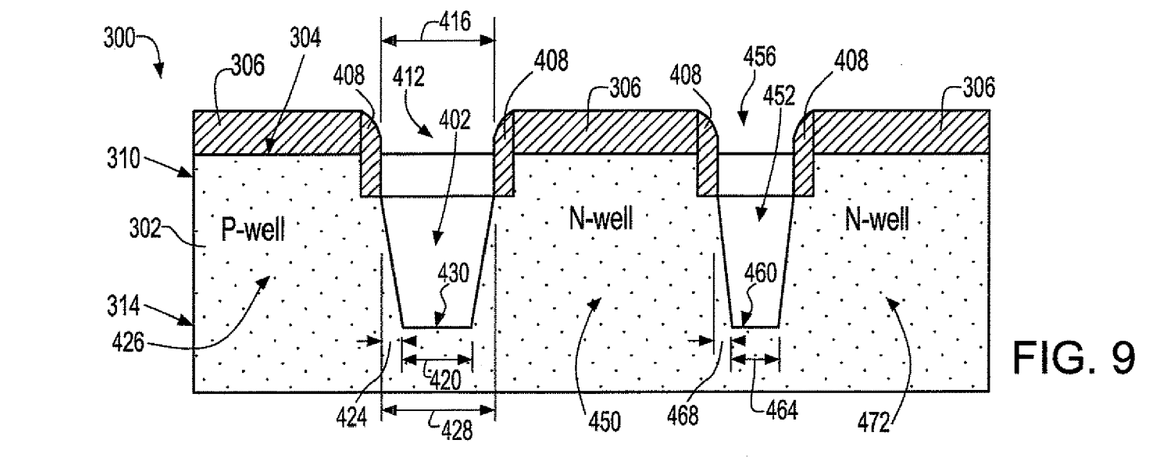
FIG. 9 is a block diagram depicting another embodiment of the invention including a silicon substrate having a pad layer over a top surface thereof and depicting an inter-well STI trench and an intra-well STI trench.

Referring to FIG. 9, an illustrative STI formation according to an embodiment 300 of the invention includes a substrate 302 which may be silicon or a silicon combination. The substrate 302 includes a pad layer 306 covering a top surface 304 of the substrate 302. Similar to the embodiment 10 shown in FIG. 1, the pad layer 306 may comprise a film stack including a thin pad oxide and an overlaying pad nitride located over the top surface 304 of the substrate 302. The substrate includes an upper portion 310 and a lower portion 314. A first inter-well STI trench 402 divides a P-well dopant region 426 and N-well dopant region 450. A second intra-well STI trench 452 divides an N-well region into N-well region 450 and another N-well region 472. The first and second STI trenches 402, 452 may be formed using conventional lithographic and etching methods known in the semiconductor manufacturing industry. Dopant areas 426, 450, 472 were previously formed into the substrate utilizing techniques that are known to those skilled in the art. The STI trenches 402, 452 are etched to specified dimensions including depth and width. The first and second trenches 402, 452 have nitride spacers 408 on opposing sides of the mouths or openings 412, 456 of the trenches 402, 452. The nitride spacers 408 can be formed as described in the previous embodiment 10 referring to FIGS. 2 and 3.

The first STI trench 402 is generally "V" shaped and includes a mouth 412 width 416 which is larger than the width 420 at the lower portion 430 of the first trench 402. The difference in the width 416 at the mouth 412 of the trench 402 and the width 420 at the lower portion 430 of the trench 402 is a specified amount 424 determined by the desired dimensions of the STI trench 402.

The second STI trench 452 is also generally "V" shaped and also includes a mouth 456 having a width 454 which is larger than the width 464 at the bottom 460 of the second trench 452. As with STI trench 402, the difference in the width 454 at the mouth 456 of the trench 452 and the width 464 at the bottom 460 of the trench 452 is a specified amount 468 determined by the desired dimensions of the trench 452. The first STI trench 402 is generally wider than the second STI trench 452 because the first STI trench 402 provides isolation between P-well 426 and N-well 450. The second STI trench 452 provides partial isolation between two N-wells 450, 472. Thus, since the second STI trench 452 provides isolation as well as maintaining the N-wells 450, 472 electrical conductivity, the dimensions of the second STI trench 452 differ from the first STI trench 402.

Figure 10:
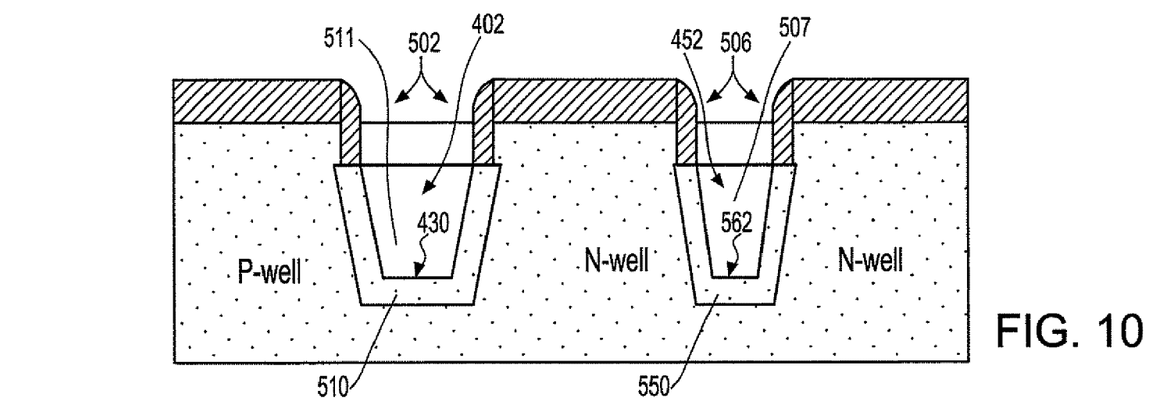
FIG. 10 is a block diagram of the silicon substrate shown in FIG. 9 depicting a boron implantation region adjacent to the trenches.

Referring to FIG. 10, the first STI trench 402 is subjected to an angled boron implant 502 forming an implant region 510 adjacent to the open well 511 of the STI trench 402. The dimensions of the first implant region 510 are determined by the angle of the trajectory of the boron implantation. For example, if the trajectory of the boron implantation is substantially vertical, then the boron implant at the bottom 430 of the trench 402 will be larger than in other areas along the trench not directly impacted by the implant trajectory. The dimensions of the second implant area 550 are similarly determined by the boron implant trajectory 506. Thus, the dimensions of the boron implant area 510, 550 are determined by the angle of the implant trajectories 502, 506, not by using a mask. Therefore, the method according of the present invention eliminates the need for a masking procedure when forming the trenches. The elimination of a masking procedure favorably impacts manufacturing costs and production time of a semiconductor wafer.

Figure 11:
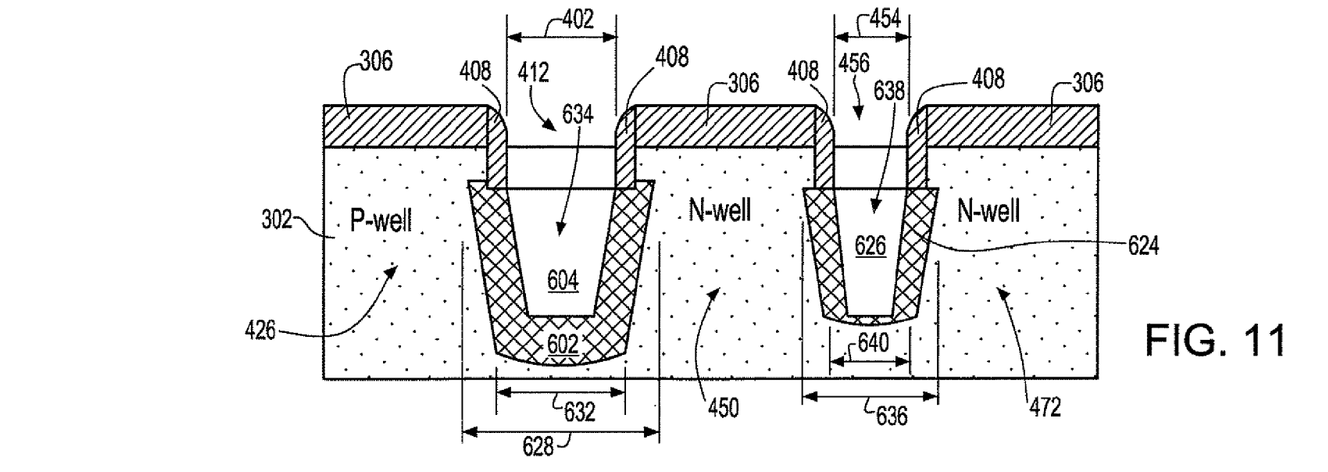
FIG. 11 is a block diagram of a porous silicon region formed in the silicon substrate of the trench shown in FIGS. 9-10.

Referring to FIGS. 10-11, the boron implant areas 510, 550 are anodized using, for example, hydrofluoric acid (HF) to form pores in the boron implant areas 510, 550. The anodization results in forming a first porous silicon region 602 or first implant region, which is generally "V" shaped, adjacent to the open well 604 of the first trench 634. Similarly, the anodization results in forming a second porous silicon region 624 or second implant area, which is generally "V" shaped, and adjacent to the open well 626 of the second trench 638. As shown in FIG. 11, the first porous silicon region 602 has an upper width 628 which is larger than the width 402 of the mouth 412 of the first STI trench 634. Similarly, the second porous silicon region 624 has an upper width 636 which is larger than the width 454 of the mouth 456 of the second STI trench 638.

Figure 12:
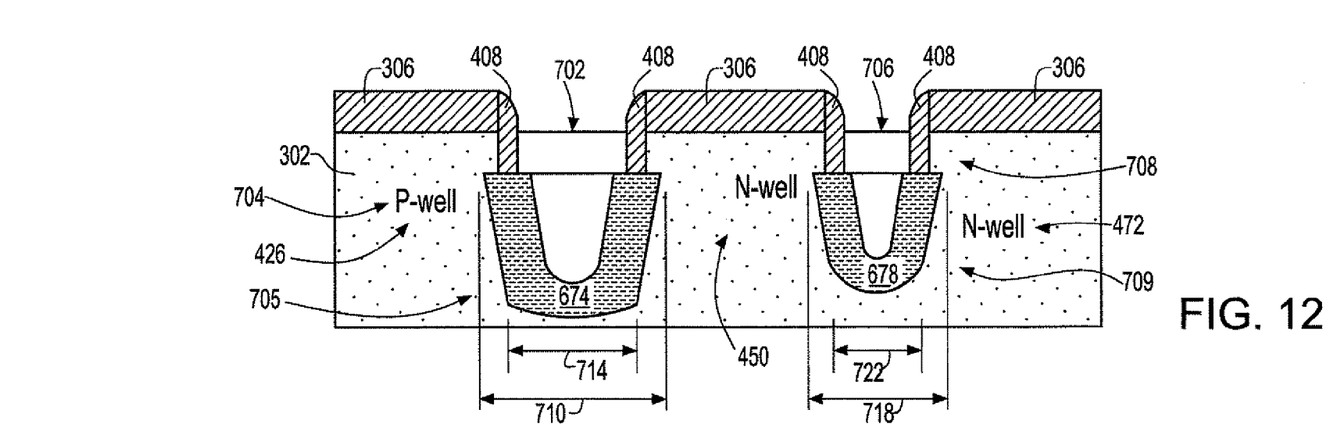
FIG. 12 is a block diagram depicting oxidized trench regions of the silicon substrate shown in FIG. 11.

Referring to FIGS. 11 and 12, the porous silicon regions 602 and 624 are oxidized to form "V" shaped oxidized regions 674, 678. The oxidation can be implemented with known techniques which may include, for example, low temperature oxidation. The oxidation results in forming the "V" shaped first oxidation region 674 which has a width 710 at an upper portion 704 adjacent the spacers 408 that is wider than the mouth 412 width 402 (shown in FIG. 11) of the first STI trench 702. The upper portion 704 width 710 is wider than the width 714 at a lower portion 705 of the first oxidation region 674. Similarly, the oxidation results in forming the "V" shaped second oxidation region 678 which has a width 718 at an upper portion 708 adjacent the spacers 408 that is wider than the mouth 456 width 454 (shown in FIG. 11) of the second STI trench 706. In the second oxidation region 678, the upper portion 708 width 718 is wider than the width 722 at the lower portion 709 of the second oxidation region 678.

Figure 13:
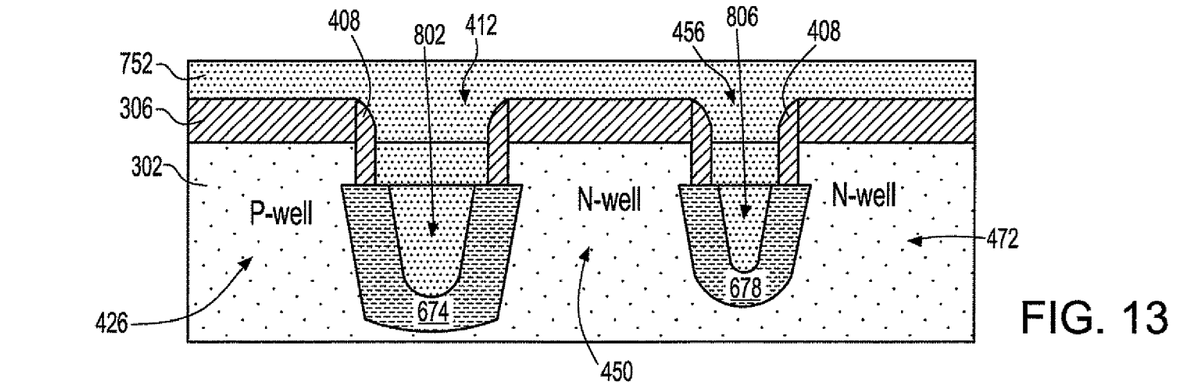
FIG. 13 is a block diagram depicting a dielectric layer over the substrate and filling the trenches shown in FIG. 12.

Referring to FIG. 13, an oxide layer 752 is formed using conventional methods which may include, for example, a high-density plasma (HDP) method. The oxide layer 752 is formed over the pad layer 306 and fills the first and second STI trenches 802, 806, respectively, as shown in FIG. 13 to form "V" shaped first and second oxide filled regions 810, 814. The dimensions of the first and second trenches 802, 806 are the same as for the first and second trenches 702, 706, respectively, shown in FIG. 12.

Figure 14:
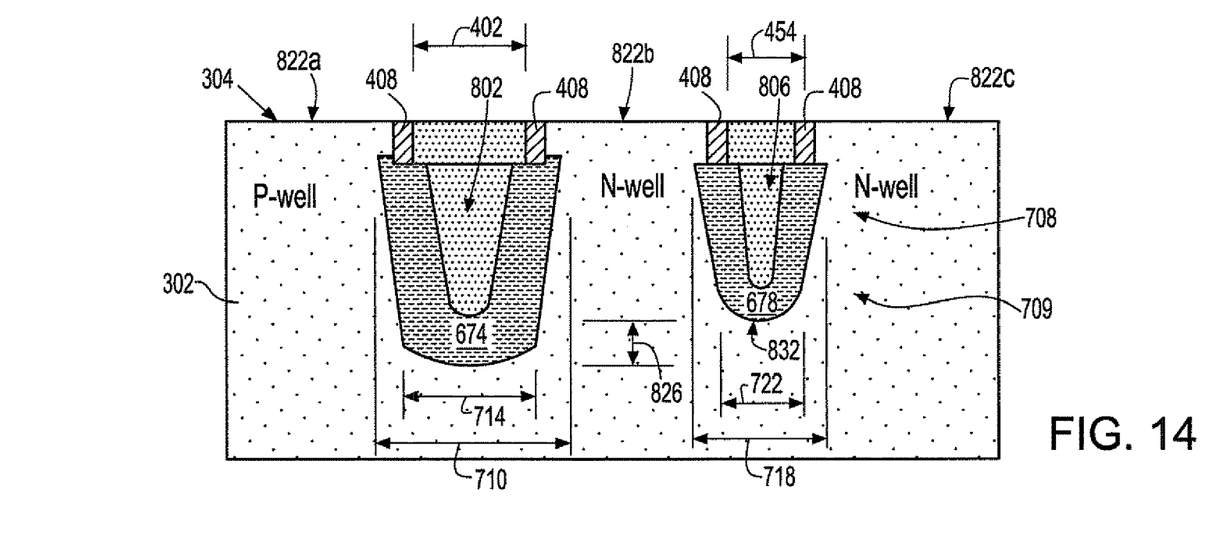
FIG. 14 is a block diagram depicting the dielectric layer and pad layer removed and the trenches are dielectric filled and having oxidized trench regions.

Referring to FIGS. 13 and 14, the oxide layer 752 and the pad layer 306 are both removed, as shown in FIG. 14, using conventional planarization techniques to expose the top surface 304 of the substrate 302. The oxide filled first STI trench 802, which includes the "V" shaped oxide filled region 674, includes nitride spacers 408 in the upper portion of the first STI trench 802 adjacent to the top surface 304. The dimensions of the first and second "V" shaped oxide regions 674, 678, respectively, are shown in FIGS. 12 and 14, and are part of the first and second oxide filled STI trenches 802, 806, respectively.

More specifically, the first oxide trench 802 mouth 412 (shown in FIG. 13) adjacent the top surface 304 of the substrate 302 has a specified width 402. The first oxide trench 802 includes the oxide filled "V" shaped region 674. The second oxide trench 806 mouth 456 is also adjacent the top surface 304 of the substrate 302 and has a specific width 454. The second oxide trench 806 includes the oxide filled "V" shaped region 678. Both the "V" shaped regions 674, 678 are wider than the mouths 408, 456 of the first and second trenches, 802, 806, respectively. The mouth widths 402, 454 are smaller than the upper and lower widths 710, 714, 718, 722, respectively, of the oxide filled "V" shaped regions 674, 678, respectively.

Thus, more of the valuable real estate on the top surface 304 of the substrate 302 is left for electrical component development while the "V" shaped portions 674, 678 of the trenches 802, 806 are wider and of a specified depth to provide the desired isolation between the P-well 426 and the N-well 450, and within the N-well between N-wells 450 and 472.

Electrical elements can be formed in electrical component areas 822a, 822b, 822c on the top surface 304 of the silicon substrate 302 using conventional techniques which may include, techniques used during typical CMOS or BiCMOS processing of semiconductors. The electrical elements 202 may be, for example, MOSFETs (metal-oxide-semiconductor field-effect transistors), similar to the MOSFETs 202 shown in FIG. 8. Thus, the oxide filled first STI trench 802 can isolated electrical components formed on electrical component areas 822a and 822b isolating the P-well and the N-well electrical component areas 822a, 822b, respectively. The oxide filled second trench 806 can isolate electrical components formed on electrical component areas 822b and 822c isolating the components within the N-well creating two N-well electrical component areas 822b, 822c isolated from one another. The "V" shaped portion 678 of the STI trench 806 is less in depth than the "V" shaped portion 674 of the STI trench 802 by a specified amount 826. The depth of the "V" shaped portion 678 is designed to provide isolation between the N-wells 450, 472 while providing necessary electrical contact between the N-wells 450, 472 underneath the bottom 832 of the STI trench 806.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A semiconductor structure comprising:
   a substrate having at least one well including a dopant; and
   at least one STI trench in the substrate including an upper portion of the at least one STI trench defining a width of a trench opening at a surface of the substrate, and the at least one STI trench including an oxidized porous region in the substrate adjacent a bottom portion of the at least one STI trench and
   the at least one STI trench is filled with a dielectric oxide, wherein the at least one STI trench includes a first STI trench defining a first opening having a first width, and a second STI trench defining a second opening having a second width, and the oxidized porous region of the first trench having a first width and a first depth, and the oxidized porous region of the second trench having a second width and a second depth.

2. The structure of claim 1, wherein the oxidized porous region of the at least one STI trench includes a width greater than the width of the trench opening.

3. A semiconductor structure comprising:
   a substrate having at least one well including a dopant; and
   at least one STI trench in the substrate including an upper portion of the at least one STI trench defining a width of a trench opening at a surface of the substrate, and the at least one STI trench including an oxidized porous region in the substrate adjacent a bottom portion of the at least one STI trench and
   the at least one STI trench is filled with a dielectric oxide, wherein the at least one well is a first well having a first dopant of a first conductivity and further including a second well in the substrate having a second dopant of a second conductivity; and
   the at least one STI trench is a first trench which divides an upper portion of the first and second wells and a second STI trench which divides the upper portion of the first well or the second well, and upper portions of the first and second STI trenches defining first and second widths of first and second trench openings, respectively, and both the first and second trenches including the oxidized porous region.

4. The structure of claim 3 wherein the first STI trench is wider and deeper than the second STI trench including their respective oxidized porous regions.

5. The structure of claim 3 wherein the first STI trench is deeper than the second STI trench and located between the first well having an n-type dopant and the second well having a p-type dopant, and the second STI trench is located within the second well.

6. The structure of claim 5 wherein the second trench is adapted to allow the second electrical conductivity within the second well beneath a bottom of the second STI trench.

7. The structure of claim 3 wherein the first and second STI trenches both include upper implant regions having a greater width than lower implant region widths and the widths of both the tower and upper implant regions being greater than widths of their respective trench opening widths.

* * * * *